United States Patent
Saito et al.

(10) Patent No.: US 6,221,200 B1
(45) Date of Patent: *Apr. 24, 2001

(54) INSTRUMENT FOR PRODUCTION OF SEMICONDUCTOR DEVICE AND PROCESS FOR PRODUCTION THEREOF

(75) Inventors: Kazuo Saito; Takeshi Ishimatsu, both of Tokyo (JP)

(73) Assignee: Nisshinbo Industries Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 08/899,882

(22) Filed: Jul. 24, 1997

Related U.S. Application Data

(63) Continuation-in-part of application No. 08/373,797, filed on Jan. 17, 1995, now abandoned.

(30) Foreign Application Priority Data

| Jan. 18, 1994 | (JP) | 6-19034 |
| Feb. 28, 1994 | (JP) | 6-54645 |
| Feb. 28, 1994 | (JP) | 6-54646 |

(51) Int. Cl.$^7$ .................................................. C23F 1/24
(52) U.S. Cl. ................ 156/345; 204/298.31; 252/502; 252/510; 252/511; 423/445 R
(58) Field of Search .............................. 156/345; 524/432; 204/298.31; 252/502, 510, 511; 423/445 R

(56) References Cited

U.S. PATENT DOCUMENTS

| 5,276,080 | * | 1/1994 | Oku ...................................... 524/432 |
| 5,871,609 | * | 2/1999 | Saito et al. ........................... 156/345 |

* cited by examiner

*Primary Examiner*—Gregory Mills
*Assistant Examiner*—Rudy Zervigon
(74) *Attorney, Agent, or Firm*—Kubovcik & Kubovcik

(57) ABSTRACT

The present invention provides an instrument for production of a semiconductor device, which consists essentially of a vitreous carbon derived from a polycarbodiimide resin, and a process for producing an instrument for production of a semiconductor device, which comprises molding a polycarbodiimide resin or a composition composed mainly of a polycarbodiimide resin, into a shape of an instrument for production of a semiconductor device and then carbonizing the molded material in vacuum or an inert gas atmosphere. Said instrument for production of a semiconductor device is free from the problems of conventional instruments and can be produced easily at a high purity and at a low cost.

9 Claims, 2 Drawing Sheets

INSTRUMENT FOR PRODUCTION OF SEMICONDUCTOR DEVICE AND PROCESS FOR PRODUCTION THEREOF

This application is a continuation-in-part application of application Ser. No. 08/373,797, filed Jan. 17, 1995, now abandoned.

BACKGROUND OF THE INVENTION (1) Field of the Invention

The present invention relates to an instrument for production of a semiconductor device as well as to a process for producing said instrument.

(2) Description of the Prior Art

The production of a semiconductor device consists of many steps and consequently, various instruments are used for each production steps. However, conventional instruments have some problem.

A Jig for Semiconductor Device

For example, in the steps for semiconductor element production, such as a plasma etching step, epitaxy step and the like, it is very important that when a semiconductor wafer makes contact with, for example, a jig used in the steps, the semiconductor wafer is neither stained nor damaged and the properties of the resulting semiconductor device are not impaired.

The semiconductor wafer, therefore, is handled very carefully. For example, when the semiconductor wafer is transferred from one step to the next step, the semiconductor wafer is supported by a jig for transfer, such as a wafer hand, wafer holder or the like.

These jigs for semiconductor wafers have heretofore been made of a material such as metal, silicon carbide, silicon oxide, zirconium oxide, Teflon (Trademark) or the like. The jigs made of such materials have caused various problems when contacted with semiconductor wafers.

For example, metals each become a direct staining source for a semiconductor wafer; silicon oxide and zirconium oxide each have a high hardness, are difficult to process, damage the semiconductor wafer, and are expensive; silicon carbide has a high hardness, is difficult to process in high precision, has a low material purity, and causes staining; and Teflon has a problem in purity of material and is difficult to obtain in a high purity.

A Semiconductor Wafer Dummy

As semiconductor integrated circuits have become finer, have a higher integration and a higher density, a plasma etching technique capable of forming a more precise and finer pattern has become more necessary. In this plasma etching, a high-frequency electric current is applied between electrodes to generate a plasma, and a silicon wafer is etched by the plasma. The free radicals and ions of halogen-based gas present in the plasma are attracted by the electric field inside an etching chamber and hit the wafer placed on the opposing electrode, whereby the wafer is etched.

When the above etching is repeated in the chamber of a plasma etching apparatus, the etched silicon and other substances are deposited and adhered on the chamber inside wall, the wafer holder, etc. Therefore, the removal of the deposited or adhered silica, etc. by cleaning becomes necessary. Currently, however, this cleaning is done manually and is generally conducted by wiping off the silicon, etc. by using, for example, a special cloth for a semiconductor device.

The above manual cleaning by using, for example, a special cloth for a semiconductor device to wipe off the silicon, etc. requires a long time in a cleaning operation and includes a high possibility of secondary staining with human sweat. For these reasons, development of a new cleaning method has become necessary.

In order to solve the above problems, there was proposed a method which comprises fixing, in a plasma etching chamber, a material resistant to plasma etching as a dummy for a wafer, and generating a plasma in the chamber to remove the deposited silicon, etc. by etching. As the material resistant to plasma etching, usable as a dummy for a wafer, there were studied quartz, silicon carbide, graphite and the like.

However, these materials have problems. That is, quartz cannot be used as a dummy because of insulation; silicon carbide is expensive and is difficult to process and obtain at a high purity; and graphite has a detrimental drawback of powder detachment and cannot be used as a dummy although it is inexpensive and can easily be processed and obtained at a high purity.

Boats for Supporting Semiconductor Wafers

Boats for supporting semiconductor wafers are used for various purposes such as (1) supporting of semiconductor wafers thereon, (2) prevention of detachment of said wafers in a diffusion treatment in diffusion furnace and (3) transfer of said wafers before and after diffusion treatment. As semiconductor devices have become integrated more highly and have come to possess higher performances in recent years, a necessity has become greater for a boat for supporting semiconductor wafers which is resistant to a heat treatment at high temperatures and which can be produced easily at a high purity.

Conventional boats for supporting semiconductor wafers include, for example, a boat described in Japanese Patent Application Rokai (Laid-Open) No. 60-107843. In this boat, however, since the constituent members are made of quartz or silicon, strain, cracking and chipping occur during the formation of grooves (e.g. rod grooves for supporting wafers); as a result, semiconductor wafers are rubbed against the defective portions of rods, resulting in generation of dust, damaging of wafers, and appearance of dislocation defects in wafers.

OBJECT AND SUMMARY OF THE INVENTION

The object of the present invention is to provide an instrument for production of a semiconductor device which is free from the abovementioned problems of the prior art, as well as a process for producing said instrument.

Another object of the present invention is to provide a jig for a semiconductor device which can protect a semiconductor wafer from being stained or damaged, and which can be produced easily at a high purity and at a low cost.

Another object of the present invention is to provide a boat for semiconductor wafers which generates no dust, and which can be produced easily at a high purity and at a low cost.

Still another object of the present invention is to provide a semiconductor device dummy used in plasma etching which can easily be processed and obtained at a high purity and at a low cost, and which causes no powder detachment.

The present invention provides:

an instrument for production of a semiconductor device, which consists essentially of a vitreous carbon derived from polycarbodiimide resin, and a process for producing an instrument for production of a semiconductor device, which comprises molding a polycarbodiimide resin or a composition composed mainly of a polycarbodiimide resin, into a shape of an instrument for production of a semiconductor device and then carbonizing the molded material in a vacuum or an inert gas atmosphere.

DETAILED DESCRIPTION OF THE INVENTION

The present invention is hereinafter described in detail.

An instrument for production of a semiconductor device of the present invention includes various variations, such as parts, instruments and tools of production equipment or inspection equipment that come in direct contact with the semiconductor device, or the semiconductor wafer during their production or inspection stage, as well as parts, instruments and tools of production equipment or a inspection equipment that does not come in direct contact with the semiconductor device or the semiconductor wafer and does not produce contaminant.

Such an instrument for production of a semiconductor device is exemplified by a jig for a semiconductor device, a semiconductor wafer dummy and a boat for supporting semiconductor wafers etc.

The jig for a semiconductor device mentioned in the present invention includes jigs for wafer transfer or wafer inspection, such as a wafer hand, wafer holder and the like as mentioned above. These jigs have been produced in the past by processing a metal, silicon carbide, silicon oxide, zirconium oxide, Teflon or the like.

The semiconductor wafer dummy mentioned in the present invention has been used in a method which comprises fixing, in a plasma etching chamber, a semiconductor wafer dummy made of a material resistant to plasma etching, and generating a plasma in the chamber to remove the deposited silicon, etc. by etching. As the material of a dummy for a wafer, there were previously studied quartz, silicon carbide, graphite and the like.

Figure 1:
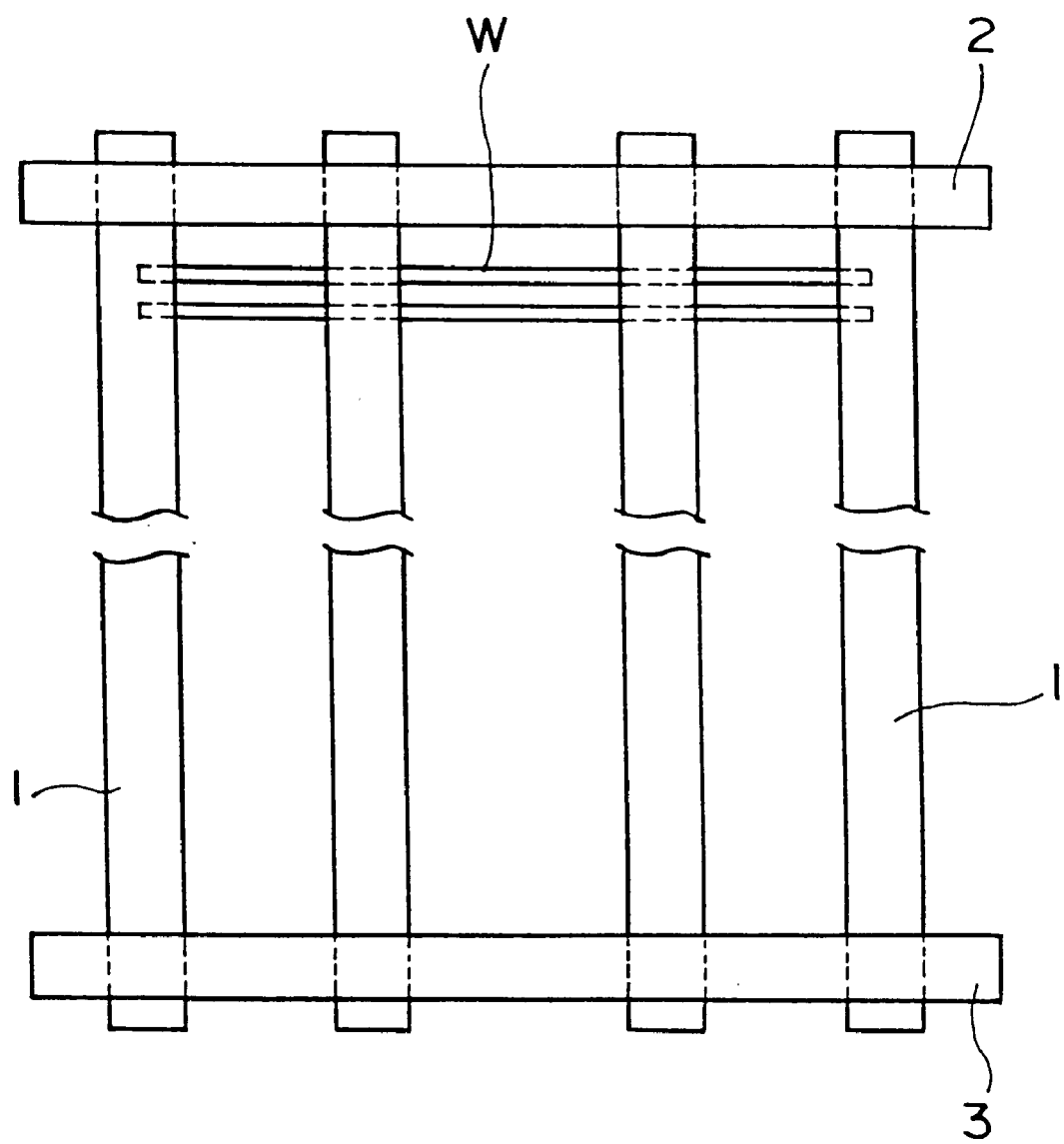
FIG. 1 is a side view of an example of the boat for supporting semiconductor wafers according to the present invention.
Figure 2:
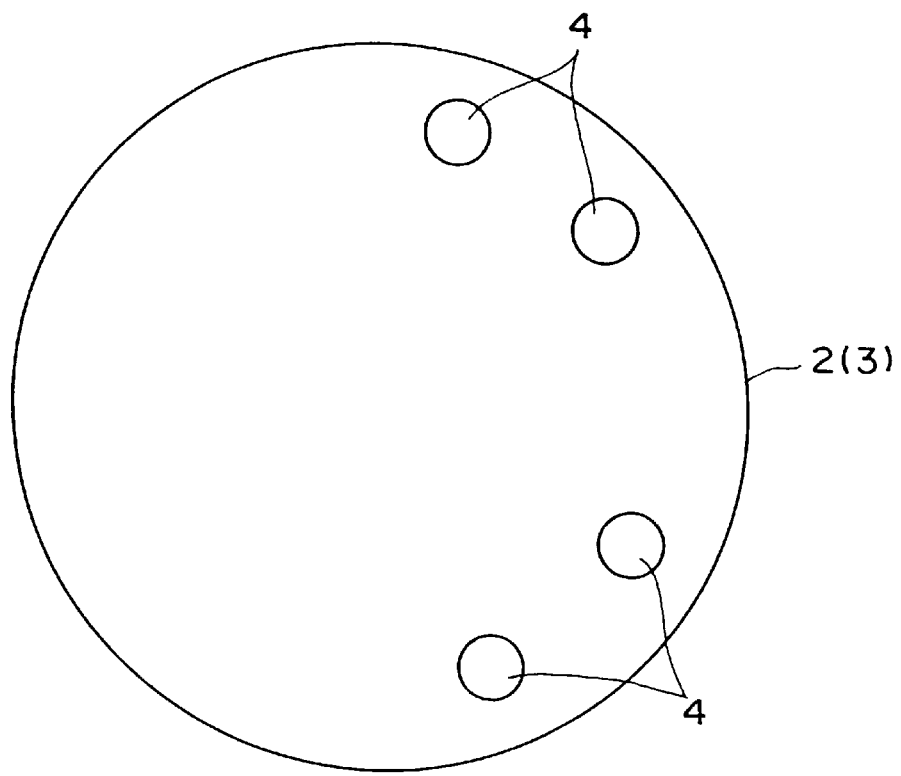
FIG. 2 is a plan view of a fixing plate used in the boat for supporting semiconductor wafers according to the present invention.

The boat for supporting semiconductor wafers mentioned in the present invention is, for example, as shown in FIG. 1, basically constituted by the main members, i.e. four supporting rods 1 and a pair of fixing plates 2 and 3. As shown in FIG. 2, the four supporting rods 1 are fixed by each being inserted into one of the four holes 4 formed in each of the fixing plates 2 and 3, whereby the boat is self-supported.

Figure 3:
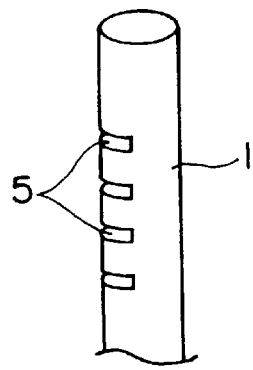
FIG. 3 is a perspective view of a rod used in the boat for supporting semiconductor wafers according to the present invention.

As shown in FIG. 3, each supporting rod 1 has, at a side, a plurality of grooves 5 for supporting semiconductor wafers. When the supporting rods 1 and the fixing plates 2 and 3 are assembled into a boat for supporting semiconductor wafers, the grooves of the supporting rods 1 are directed roughly toward the center of the boat, whereby semiconductor wafers W can be supported between the fixing plates 2 and 3 by the grooves 5 as shown in FIG. 1. As the material of a boat, there were previously used quartz or silicon, In the present invention, the instrument for production of semiconductor device is made essentially of a vitreous carbon derived from a polycarbodiimide resin. In case of the above-mentioned boat for supporting semiconductor wafers, not only the main members (supporting rods and fixing plates) but also the auxiliary members such as grip a and the like (if they are used) are each made of a vitreous carbon derived from a polycarbodiimide resin.

The polycarbodiimide resin can he produced by a per se known process or a process similar thereto [e.g. , U.S. Pat. No. 2,941,956; Japanese Patent Publication No. 47-33279; J. org. Chem., 28, 2069–2075 (1963); Chemical review 1981, Vol. 81, No. 4, 619–621]. It can easily be produced, for example, by subjecting an organic diisocyanate to a condensation reaction (carbon dioxide is removed in the reaction) in the presence of a carbodiimidization catalyst.

The organic diisocyanate used in the above production of the polycarbodiimide resin may be any of an aliphatic type, an alicyclic type, an aromatic type, an aromatic-aliphatic type, etc. These may be used singly or in an admixture of two or more (in the latter case, a copolycarbodiimide resin is obtained).

The polycarbodiimide resin used in the present invention includes a homopolymer or a copolymer each composed of at least one repeating unit represented by the following formula

wherein R represents a residual group of an organic diisocyanate. Herein, the residual group of an organic diisocyanate refers to a portion of an organic diisocyanate which is the organic diisocyanate molecule minus two isocyanate groups (two NCO).

The above R is preferably a residual group of an aromatic diisocyanate. Specific examples of such a polycarbodiimide resin are the following.

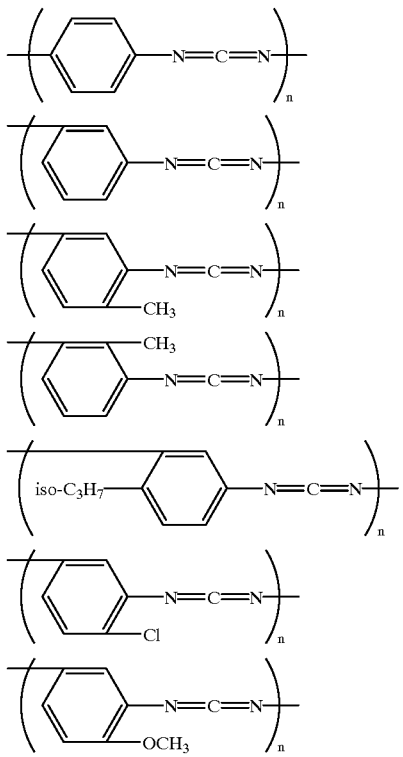

-continued

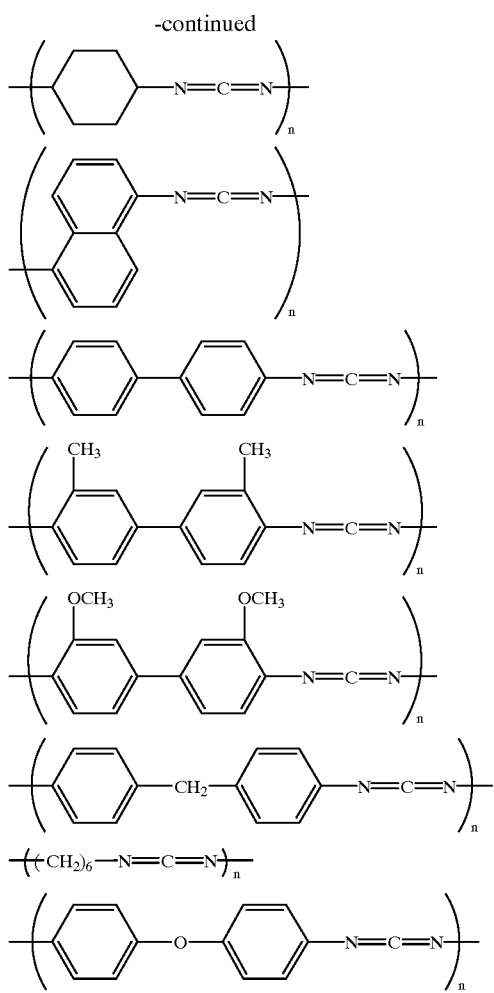

In each of the above formulas, n is 10–10,000, preferably 50–5,000; and the terminal(s) of each polycarbodiimide resin may be blocked with a monoisocyanate or the like.

Incidentally, there is known a vitreous carbon as disclosed in, for example, U.S. Pat. No. 5,152,941, produced by forming a polycarbodiimide resin powder with heating under pressure, followed by carbonization. However, in the thus obtained vitreous carbon, a boundary between the polycarbodiimide particles and micro pores remains due to the use of the powdery polycarbodiimide, as in the case of forming ceramics and graphite using powdery raw materials, and such boundary and micro pores limit the physical strength of the vitreous carbon. Also, as a matter of fact, it is impossible to eliminate solid dust which contaminate in the raw material polycarbodiimide resin as well as the production process since the raw material is a powder, and such dust limits a high purification of, obtained vitreous carbon.

The polycarbodiimide resin can be obtained in the form of a solution, or as a powder precipitated from the solution. The polycarbodiimide obtained in the form of a solution is used as it is; and the polycarbodiimide resin obtained as a powder is used after being dissolved in a solvent to convert it into a solution.

In the present invention, the polycarbodiimide resin solution is first filtered precisely. More particularly, metal particles originated from production equipment and dust are removed by the use of a Teflon (trademark) filter having a pore size of 1 mm or below, preferably 0.1–0.5 $\mu$m. It is effective to use an ion exchange resin jointly to remove metal salts. By passing the resin solution through the fine filter, fine lump-like gel produced by a side reaction or over reaction is removed from the resin solution, as well as the metal particles and dust. The filtered resin solution contains very small amounts of impurities, and become homogeneous.

Second, the polycarbodiimide resin solution is made into a molded material having a shape of an instrument for production of a semiconductor device (such as a jig for a semiconductor device {typically, a wafer hand or a wafer holder}, a semiconductor wafer dummy or a boat for supporting semiconductor wafers). The method of forming the molded material is not particularly restricted and can be a method generally used in the production of such an instrument for production of semiconductor devices, such as injection molding, compression molding, liquid injection molding, vacuum molding or the like.

Then, the molded material having a shape of an instrument for production of a semiconductor device is heated to carbonize the polycarbodiimide resin, whereby an intended instrument for production of a semiconductor device according to the present invention can be produced. The carbonization step can be conducted in a vacuum or in an inert gas atmosphere such as nitrogen gas or the like. The final firing temperature is preferably 1,000–3,000° C. The molded material may be subjected to preliminary heating, before carbonization.

The thus obtained instrument for production of a semiconductor device according to the present invention is made essentially of a vitreous carbon obtained from the homogeneous polycarbodiimide resin solution of high purity, having a bulk density of 1.51–1.8 g/cm$^3$, a bending strength of 1,800–4,000 kg/cm$^2$, a shore hardness of 121–140, a porosity of 0–0.09% and an ash content of 0–4 ppm. Therefore, the present invention is able to provide an instrument for production of a semiconductor device which is free from the problems of the prior art.

For example, the jig protects a semiconductor wafer from being stained or damaged and can easily be produced at a high purity and at a low cost. The present jig for a semiconductor device can also be used as a jig for magnetic tape.

The jig for a semiconductor, the semiconductor device wafer dummy and the boat for supporting semiconductor wafers ets. of the present invention each has a high strength, and does not produce chipping which causes dust when the silicon wafer is contacted with the jig or boat while a silicon wafer is changed or transported, resulting in a high production yield of semiconductor devices.

The semiconductor device dummy used in plasma etching is processed easily and obtained at a high purity and at a low cost, and causes no powder detachment. This semiconductor device dummy is used in a method for cleaning of plasma etching chamber inside and the like by fixing the wafer dummy inside the chamber of a plasma etching apparatus, and then generating a plasma inside the chamber.

The boat for a semiconductor wafers generates no dust, and can be produced easily at a high purity and at a low cost. The boat is used for various purposes such as (1) supporting of semiconductor wafers thereon, (2) prevention of detachment of said wafers in a diffusion treatment in a diffusion furnace and (3) transfer of said wafers before and after diffusion treatment.

The present invention is hereinafter described in more detail by way of Examples.

EXAMPLE 1

54 g of a 2,4-tolylene diisocyanate/2,6-tolylene diisocyanate mixture (80:20) was reacted in 500 ml of tetrachloroethylene in the presence of 0.12 g of a carbodiimidization catalyst (1-phenyl-3-methylphospholene oxide) at 120° C. for 4 hours to obtain a polycarbodiimide resin solution. The resin solution was injected into a metal mold corresponding to the shape of an intended jig for a semiconductor device, and molding was conducted at 60° C. for 20 hours and then at 120° C. for 10 hours. The resulting molded material was taken out of the mold. The molded material was heat-treated at 200° C. for 10 hours and then heated to 2,000° C. in an argon atmosphere, whereby a wafer holder of 50 mm×65 mm×5 mm (thickness), which consists essentially of a vitreous carbon derived from polycarbodiimide resin was produced.

The wafer holder had excellent properties, i.e. a bulk density of 1.55 g/cm$^3$, a bending strength of 2,700 kg/cm$^2$, a Shore hardness of 130, a porosity of 0% and an ash (impurity) content of 2 ppm.

Using the wafer holder, 1000 and 2,000 semiconductor device silicon wafers were transferred. The results are shown in Table 1.

Comparative Example 1

A jig for a semiconductor device having the same shape and size as the jig of Example 1 was produced using silicon carbide. The jig was subjected to the same test as in Example 1. The results are shown in Table 1.

TABLE 1

|  | Wafer staining | | Wafer damage | |
| --- | --- | --- | --- | --- |
|  | 1000 times | 2000 times | 1000 times | 2000 times |
| Example 1 | No | No | No | No |
| Comparative Example 1 | 27 wafers stained | 130 wafers stained | 20 wafers damaged | 123 wafers damaged |

As stated above, the present jig for a semiconductor device is made essentially of a vitreous carbon derived from polycarbodiimide resin, neither stains nor damages a semiconductor wafer, and is low in wear.

EXAMPLE 2

The polycarbodiimide resin obtained in Example 1 was cast into a metallic mold which corresponded to the shape of a wafer dummy to be obtained, and was heat-treated at 60° C. for 20 hours and then at 120° C. for 10 hours for molding. The resulting molded material was taken out of the mold and heat-treated at 200° C. for 10 hours. Then, the material was heated to 2,000° C. in nitrogen gas to obtain a semiconductor wafer dummy of 6 inches in diameter. The wafer dummy was made of a vitreous carbon having an apparent density of 1.55 g/cm$^3$, a Shore hardness of 125, a bending strength of 2,500 kg/cm$^2$, a porosity of 0.01% and an ash content of 2 ppm.

100 silicon wafers were subjected to an etching treatment under the following conditions, using a plasma etching apparatus made by Tokyo Electron.

Etching conditions:

Carrier gas: nitrogen

Etching gas: $CF_2/O_2$ mixed gas

Vacuum: 0.8 Torr

Temperature: 250° C.

RF power: 13.56 MHz, 3.5 A

Then, the wafer dummy obtained above was set in the plasma etching apparatus in place of the silicon wafer, and an etching treatment for cleaning was conducted for 1 minute. Thereafter, 100 silicon wafers were treated and they were measured for number of particles of dust and number of dislocation defects. The results are shown in Table 2. Incidentally, "number of particles of dust" refers to the average particles of numbers of dust each having a size not smaller than 0.16 μm, and "number of dislocation defect" refers to the number of wafers (of 100 treated wafers) in which dislocation defects were found. (The same applies to hereinafter.)

Comparative Example 2

The procedure of Example 2 was repeated except that no cleaning step using a semiconductor wafer dummy was conducted. The results are shown in Table 2.

Comparative Example 3

The procedure of Example 2 was repeated except that instead of the cleaning step using a semiconductor wafer dummy, there was conducted wiping-off with a special cloth for a semiconductor device and methanol. The results are shown in Table 2.

TABLE 2

|  | Number of dust particles | Number of dislocation defects |
| --- | --- | --- |
| Example 2 | 2 | 0 |
| Comparative Example 2 | 850 | 41 |
| Comparative Example 3 | 1567 | 65 |

As stated above, the semiconductor wafer dummy of the present invention is made essentially of a vitreous carbon, therefore, the dummy generates no dust and hardly causes staining of wafer, i.e. formation of dislocation defects.

EXAMPLE 3

The polycarbodiimide resin obtained in Example 1 was cast into metallic molds corresponding to the supporting rods and fixing plates shown in FIGS. 1 to 3, and heat-treated at 60° C. for 12 hours and then at 120° C. for 10 hours. The resulting molded materials were taken out of the molds and heat-treated at 200° C. for 10 hours. The resulting materials were heated to 2,000° C. in nitrogen gas to obtain main members of a boat for supporting semiconductor wafers. The main members were made of a vitreous carbon having an apparent density of 1.55 g/cm$^3$, a Shore hardness of 125, a bending strength of 2,000 kg/cm$^2$, a porosity of 0.01% and an ash content of 2 ppm.

The main members were assembled into a boat for supporting semiconductor wafers. Using the boat, semiconductor silicon wafers were transferred under the following conditions, after which the dust and dislocation defects present on the wafers were examined. That is, 100 semiconductor silicon wafers were supported on the boat and inserted into a diffusion furnace maintained at 900° C., at a speed of 200 mm/min.

The temperature inside the furnace was elevated to 1,200° C. at a rate of 10° C./min. At this temperature for 1 hour, the wafers supported on the boat were subjected to dry oxidation. Then, the temperature inside the furnace was lowered to 900° C. at a rate of 5° C./min. Thereafter, the wafers on the boat were taken out of the furnace at a speed of 200 mm/min. The results are shown in Table 3.

Comparative Example 4

Main members (each made of quartz) were assembled into a boat for supporting semiconductor wafers. Using the boat, semiconductor silicon wafers were transferred under the same conditions as in Example 3, after which the dust and dislocation defects present on the wafers were examined. The results are shown in Table 3.

TABLE 3

|  | Number of dust particles | Number of dislocation defects |
|---|---|---|
| Example 3 | 7 | 0 |
| Comparative Example 4 | 850 | 41 |

As stated above, the members constituting the present boat for supporting semiconductor wafers are made essentially of a vitreous carbon, therefore, the present boat for supporting semiconductor wafers generates no dust and hardly cause the staining and dislocation defects of wafers.

EXAMPLE 4

The procedure of Example 1 was repeated except that molding was conducted at 60° C. for 20° C. hours and then at 150° C. for 5 hours to produce a semiconductor wafer dummy of 6 inches in diameter and a jig, for a semiconductor. The 6 inch semiconductor device wafer dummy was dropped on a SiC plate which is used generally in a semiconductor production process from 10 mm above for 10 times, and generation of chipping on the wafer dummy was observed. Also, the 6 inch semiconductor wafer dummy was dropped on the jig for a semiconductor device from 10 mm above for 10 times, and generation of chipping on the jig for a semiconductor device was observed. The results are shown in Table 4.

EXAMPLE 5

A semiconductor wafer dummy of 6 inches in diameter and a jig for a semiconductor device were produced in the same manner as in Example 3, and generation of chipping was observed. The results are shown in Table 4.

EXAMPLE 6

A semiconductor wafer dummy of 6 inches in diameter and a jig for a semiconductor device were produced in the same manner as in Example 2, and generation of chipping was observed. The results are shown in Table 4.

Comparative Examples 4–6

50 g of a p-phenylene diisocyanate was reacted in a 880 ml of tetrahydrofuran in the presence of a carbodiimidization catalyst at 68° C. for 5 hours, and this reaction mixture was cooled to room temperature to obtain a polycarbodiimide resin as a precipitate. The precipitate was filtered and dried at 100° C. for 2 hours to obtain a polycarbodiimide resin powder. The procedure of Example 4 was repeated except that molding of the polycarbodiimide resin powder was conducted at 200° C./100 Kgcm$^2$ (Comparative Example 4), 250° C./150 Kgcm$^2$ (Comparative Example 5) and 250° C./200 Kgcm$^2$ (Comparative Example 6) each for 1 hour to produce a semiconductor wafer dummy of 6 inches in diameter and a jig for a semiconductor device. Generation of chipping was observed in the sane manner as in Example 4. The results are shown in Table 4.

TABLE 4

|  | Strength | Generation of chipping | |
|---|---|---|---|
| Wafer dummy or jig | (Kg/cm$^2$) | Wafer dummy | Jig |
| Example 4 | 1800 | None | None |
| Example 5 | 2000 | None | None |
| Example 6 | 2500 | None | None |
| Comparative Example 4 | 1000 | Yes (large size) | Yes (large size) |
| Comparative xample 4 | 1250 | Yes | Yes |
| Comparative Example 4 | 1500 | Yes | Yes |
| Silicon wafer | — | Yes (large size) | — |

What is claimed is:

1. An instrument for production of a semiconductor device, said instrument consisting essentially of a vitreous carbon derived from polycarbodiimide resin and being a jig for production of a semiconductor device.

2. A jig for production of a semiconductor device according to claim 1, wherein the jig is a wafer holder.

3. A jig for production of a semiconductor device according to claim 1, wherein the jig is a semiconductor wafer dummy.

4. An instrument for production of a semiconductor device, said instrument consisting essentially of a vitreous carbon derived from polycarbodiimide resin, wherein the vitreous carbon is formed by carbonizing a polycarbodiimide resin in an inert atmosphere.

5. An instrument for production of a semiconductor device according to claim 4 wherein the polycarbodiimide resin is a molded material and the carbonization of the molded material is conducted in a temperature range of 1,000–3,000° C.

6. An instrument for production of a semiconductor device, said instrument consisting essentially of a vitreous carbon derived from polycarbodiimide resin, wherein the vitreous carbon has a bulk density of 1.51–1.8 g/cm$^3$, a bending strength of 1,800–4,000 kg$^2$, a Shore hardness of 121–140, a porosity of 0–0.09% and an ash content of 0–4 ppm.

7. A process for producing an instrument for production of a semiconductor device, which comprises molding a polycarbodiimide resin or a composition composed mainly of a polycarbodiimide resin, into a shape of an instrument for production of a semiconductor device and then carbonizing the molded material in vacuum or an inert gas atmosphere.

8. A process according to claim 7, wherein the carbonization of the molded material is conducted in a temperature range of 1,000–3,000° C.

9. A method for cleaning a plasma etching chamber, which comprises fixing a wafer dummy made substantially of a vitreous carbon derived from a polycarbodiimide resin inside the chamber of a plasma etching apparatus, and then generating a plasma inside the chamber.

* * * * *